(12) United States Patent
Kar et al.

(10) Patent No.: US 11,393,934 B2
(45) Date of Patent: Jul. 19, 2022

(54) FINFET BASED CAPACITORS AND RESISTORS AND RELATED APPARATUSES, SYSTEMS, AND METHODS

(71) Applicant: Intel Corporation, Santa Clara, CA (US)

(72) Inventors: Ayan Kar, Portland, OR (US); Kinyip Phoa, Beaverton, OR (US); Justin S. Sandford, Tigard, OR (US); Junjun Wan, Portland, OR (US); Akm A. Ahsan, Portland, OR (US); Leif R. Paulson, Portland, OR (US); Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,321

(22) PCT Filed: Dec. 27, 2017

(86) PCT No.: PCT/US2017/068501
§ 371 (c)(1),
(2) Date: Mar. 24, 2020

(87) PCT Pub. No.: WO2019/132876
PCT Pub. Date: Jul. 4, 2019

(65) Prior Publication Data
US 2020/0235249 A1 Jul. 23, 2020

(51) Int. Cl.
*H01L 29/94* (2006.01)
*H01L 29/66* (2006.01)
*H01L 29/8605* (2006.01)

(52) U.S. Cl.
CPC ........ *H01L 29/94* (2013.01); *H01L 29/66166* (2013.01); *H01L 29/66189* (2013.01); *H01L 29/8605* (2013.01)

(58) Field of Classification Search
CPC ............... H01L 29/94; H01L 29/66166; H01L 29/66189; H01L 29/8605; H01L 29/66795; H01L 29/66803; H01L 29/785
USPC ....................................................... 257/296
See application file for complete search history.

(56) References Cited

U.S. PATENT DOCUMENTS

| 7,859,081 | B2 | 12/2010 | Doyle et al. |
| 8,883,585 | B1* | 11/2014 | Fumitake ............ H01L 29/6681 438/197 |
| 9,076,869 | B1* | 7/2015 | Hu ...................... H01L 29/1041 |
| 2003/0141569 | A1 | 7/2003 | Fried |

(Continued)

OTHER PUBLICATIONS

International Search Report and Written Opinion for International Patent Application No. PCT/US2017/068501 dated Sep. 21, 2018, 11 pgs.

(Continued)

*Primary Examiner* — Sheikh Maruf
(74) *Attorney, Agent, or Firm* — Schwabe, Williamson & Wyatt, P.C.

(57) ABSTRACT

This disclosure illustrates a FinFET based dual electronic component that may be used as a capacitor or a resistor and methods to manufacture said component. A FinFET based dual electronic component comprises a fin, source and drain regions, a gate dielectric, and a gate. The fin is heavily doped such that semiconductor material of the fin becomes degenerate.

22 Claims, 10 Drawing Sheets

(56) References Cited

U.S. PATENT DOCUMENTS

| | | | |
|---|---|---|---|
| 2004/0256683 A1 | 12/2004 | Lee | |
| 2005/0224890 A1* | 10/2005 | Bernstein | H01L 29/045 257/371 |
| 2007/0087574 A1 | 4/2007 | Gupta | |
| 2007/0278572 A1* | 12/2007 | Ban | H01L 29/7841 257/341 |
| 2008/0283917 A1* | 11/2008 | Cheng | H01L 29/66795 257/347 |
| 2009/0108316 A1 | 4/2009 | Xiong | |
| 2010/0207179 A1* | 8/2010 | Booth, Jr. | H01L 27/10823 257/296 |
| 2011/0298025 A1* | 12/2011 | Haensch | H01L 27/0629 257/296 |
| 2012/0187486 A1* | 7/2012 | Goto | G01N 33/6893 257/347 |
| 2012/0305893 A1 | 12/2012 | Colinge | |
| 2013/0171780 A1* | 7/2013 | Anderson | H01L 29/7841 438/164 |
| 2013/0256748 A1* | 10/2013 | Clark, Jr. | H01L 29/66795 257/173 |
| 2014/0124845 A1* | 5/2014 | Cheng | H01L 29/66181 257/310 |
| 2014/0159131 A1* | 6/2014 | Jin | H01L 27/10885 257/296 |
| 2014/0187007 A1* | 7/2014 | Cheng | H01L 29/66628 438/286 |
| 2014/0231891 A1* | 8/2014 | Basker | H01L 27/1211 257/296 |
| 2014/0307510 A1* | 10/2014 | Lin | G11C 16/0408 257/296 |
| 2015/0008490 A1* | 1/2015 | Strain | H01L 21/3083 257/288 |
| 2015/0123177 A1* | 5/2015 | Xu | G02F 1/025 257/296 |
| 2015/0155278 A1* | 6/2015 | Seo | H01L 27/0805 257/296 |
| 2015/0162323 A1* | 6/2015 | Taya | H01L 27/0629 257/296 |
| 2015/0228725 A1* | 8/2015 | Tsai | H01L 29/785 257/390 |
| 2015/0340426 A1* | 11/2015 | Wuidart | H01L 27/11524 257/296 |
| 2016/0079445 A1* | 3/2016 | Wilhelm | H01L 21/32051 257/296 |
| 2016/0093628 A1* | 3/2016 | Chen | H01L 29/66825 257/296 |
| 2016/0111418 A1* | 4/2016 | Wang | H01L 27/0635 257/296 |
| 2016/0126235 A1* | 5/2016 | Nishimura | H01L 29/866 257/296 |
| 2016/0149057 A1* | 5/2016 | Yoo | H01L 29/7851 257/296 |
| 2017/0098652 A1* | 4/2017 | Kang | H01L 27/10852 |
| 2017/0133461 A1* | 5/2017 | Hafez | H01L 29/0649 |

OTHER PUBLICATIONS

Search Report for European Patent Application No. 17936913.7, dated Jun. 24, 2021, 7 pgs.

* cited by examiner

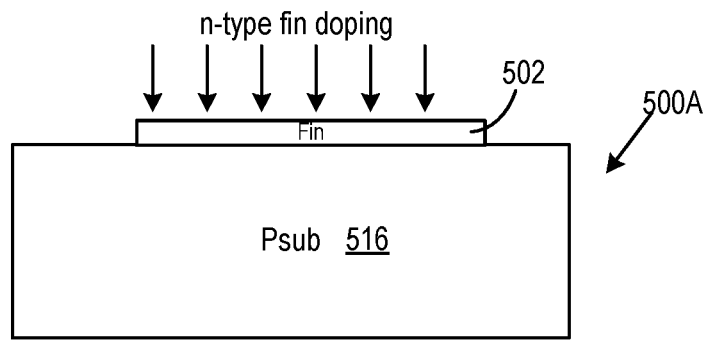
Si fin formation and heavy doping of the fin
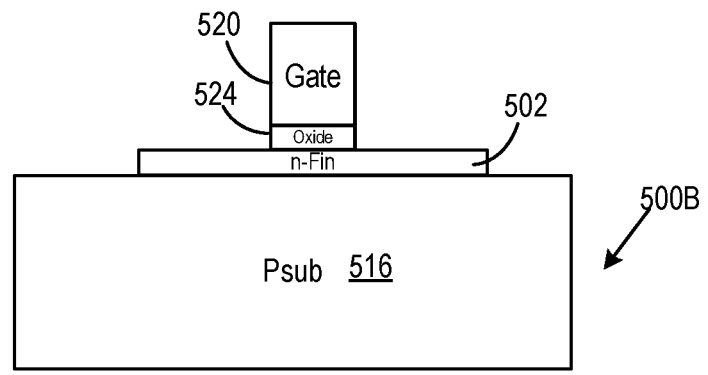
Oxide deposition and Gate formation
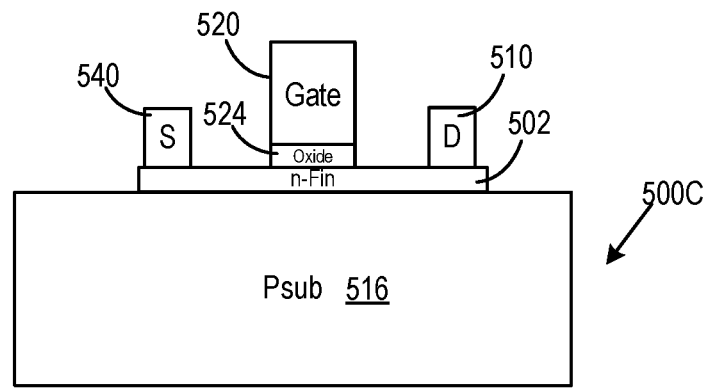
Anneal and Contact formation
FIG. 5

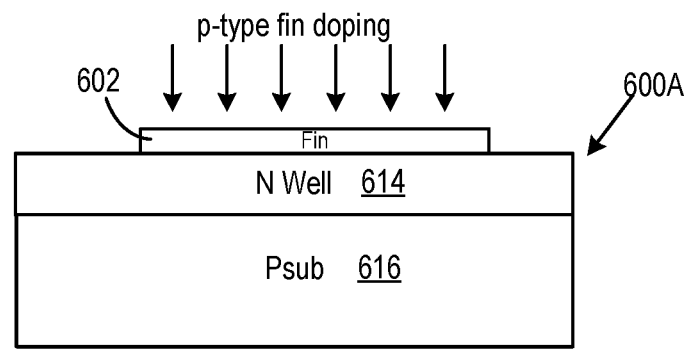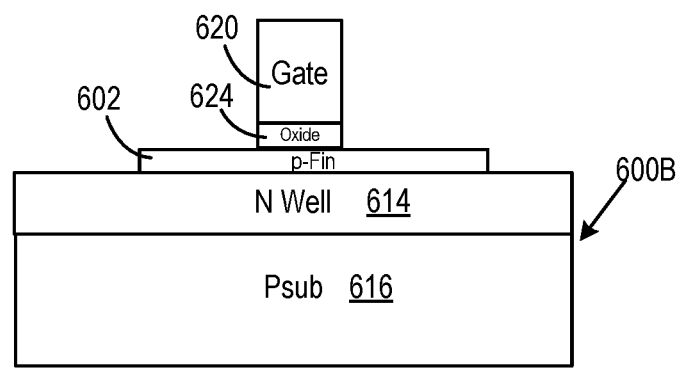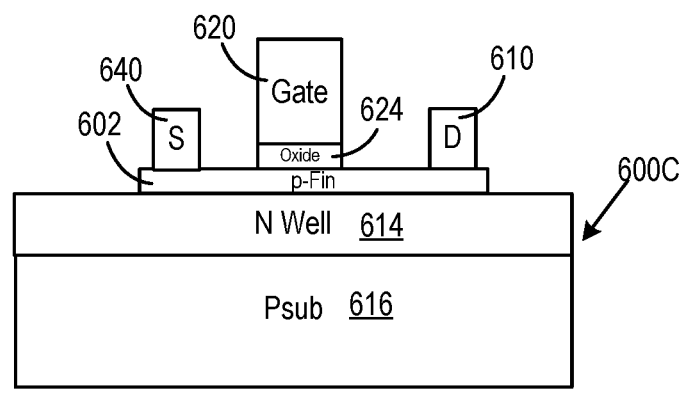
FIG. 6 understanding of the disclosure. The order of the description,
FINFET BASED CAPACITORS AND RESISTORS AND RELATED APPARATUSES, SYSTEMS, AND METHODS

CROSS-REFERENCE TO RELATED APPLICATION

This patent application is a U.S. National Phase Application under 35 U.S.C. § 371 of International Application No. PCT/US2017/068501, filed Dec. 27, 2017, entitled "FINFET BASED CAPACITORS AND RESISTORS AND RELATED APPARATUSES, SYSTEMS, AND METHODS," which designates the United States of America, the entire disclosure of which is hereby incorporated by reference in its entirety and for all purposes.

TECHNICAL FIELD

This disclosure generally relates to capacitors and resistors of an integrated circuit. Specifically, this disclosure relates to front end high density capacitors and resistors.

BACKGROUND

Semiconductor integrated chips can be fabricated in a process that includes imaging, deposition and etching. Additional steps can include doping and cleaning. Wafers (such as mono-crystal silicon wafers, silicon on sapphire wafers or gallium arsenide wafers) can be used as a substrate. Photolithography can be used to mark areas of the wafer for enhancement through doping or deposition. An integrated circuit is composed of a plurality of layers that can include diffusion layers (which can include dopants), implant layers (which can include additional ions), metal layers (defining conduction) and/or via or contact layers (which can define conduction between layers).

BRIEF DESCRIPTION OF THE DRAWINGS

FIG. 5 illustrates a cross section of a FinFET based dual electronic component on a p-type substrate during various manufacturing stages.

FIG. 6 illustrates a cross section of a FinFET based dual electronic component on an n-well during various manufacturing stages.

DETAILED DESCRIPTION

Figure 1:
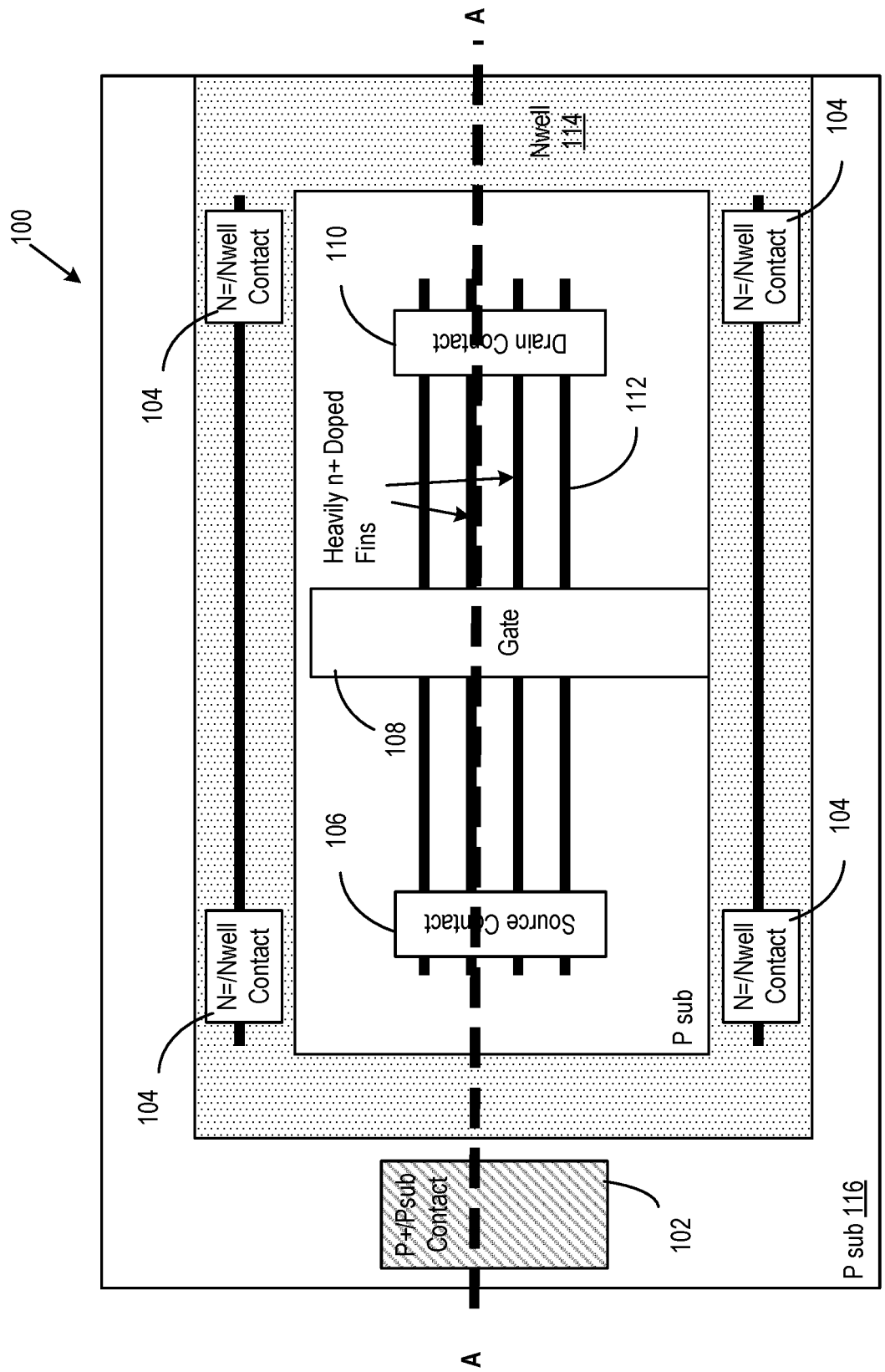
FIG. 1 illustrates a planar view of a Fin Field Effect Transistor (FinFET) based dual electronic component, according to some embodiments.

Described herein are systems using and methods of fabricating Fin Field Effect Transistor (FinFET) based dual electronic components that may be used as a front end high density capacitor or resistor. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. However, it will be apparent to one skilled in the art that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order of the description, however, should not be construed to imply that these operations are necessarily order dependent. In particular, these operations need not be performed in the order of presentation.

The terms "over," "under," "between," and "on," as used herein, refer to a relative position of one material (e.g., region, structure, layer, etc.) or component with respect to other materials (e.g., regions, structures, layers, etc.) or components. For example, one material disposed over, under, between or on another material may be directly in contact with the other material or may have one or more intervening materials. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode is formed on the gate dielectric and may consist of at least one p-type workfunction metal or n-type workfunction metal, depending on whether the transistor is to be a PMOS or an NMOS transistor. In some implementations, the gate electrode may consist of a stack of two or more metals, where one or more metals are workfunction metals and at least one metal is a fill metal. Additional metals may be included for other purposes, such as a barrier material.

For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal will enable the formation of an NMOS gate electrode with a workfunction that is between about 3.9 eV and about 4.2 eV.

In some implementations, when viewed as a cross section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may include a combination of U-shaped structures and planar, non-U-shaped structures. For example, the gate electrode may consist of one or more U-shaped metals formed atop one or more planar, non-U-shaped materials.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more metals and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Power supply noise is a concern for integrated circuit design. Significant power supply noise can result in unintentional coupling between a power supply line and another portion of the integrated circuit. If the coupling is strong enough, the coupled signal can affect the amplitude and/or timing of a signal on the other portion of the integrated circuit. For example, noise in a power line can interfere with a signal line which may result in a serious malfunction of the integrated circuit.

One approach to limit the power supply noise is to use a decoupling capacitor between the power supply and ground. The decoupling capacitor filters the noise/ripple from the supply line. For example, a backend metal finger capacitor may be used to filter the noise.

However, as integrated circuits are continually scaled smaller, it becomes challenging to offer a high density and voltage independent decoupling capacitor. For instance, the backend metal finger capacitor uses routing resources and offers a low capacitance density. The backend metal finger capacitor and similar approaches limit the scalability of an integrated circuit.

Described herein is a front end high density (FinFET based) dual electronic component that may be used as a capacitor or a resistor. The FinFET based dual electronic component can provide a voltage independent decoupling capacitor to filter the power supply capacitance. When used as a capacitor the FinFET based dual electronic component may be manufactured to have a nearly constant capacitance value at various voltage ranges.

Additionally, the FinFET based dual electronic component may be used as multiple components on an integrated circuit which may simplify the manufacturing process. For instance, the FinFET based dual electronic component when used as a capacitor can also be used in memory circuits like DRAM to hold charge. In addition, the FinFET based dual electronic component can be used as a high density high resistance precision resistor. The FinFET based dual electronic component may increase the density of an integrated chip because it may be implemented on a front end layer rather than on a back end layer.

As used herein, a degenerate semiconductor refers to a heavily doped semiconductor in which the Fermi level is located in either the valence band or the conduction band.

Additional details and examples are provided with reference to the figures below. The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

FIG. 1 illustrates a planar view of a FinFET based dual electronic component 100, according to some embodiments. The dual electronic component 100 may comprise one or more fins 112, a source region 106, a drain region 110, and a gate region 108.

The fins 112 may be made of a heavily doped semiconductor. For example, in some embodiments the fin may be silicon or germanium with dopants implanted in the fin. The dopants may be an n-type dopant or a p-type dopant. The dopant concentration is sufficient to cause the semiconductor to be degenerate. The high value of electron or hole concentration on a degenerate semiconductor may allow the fin to behave similar to a metal when transferring energy.

One of the source or drain regions 106 and 110 is located near each end of the fin. The source or drain regions 106 and 110 may serve as two contact points for the FinFET based dual electronic component 100. The material comprising the source or drain regions 106 and 110, in some embodiments, may be epitaxially deposited atop the fin 112. For example, an epitaxial silicon-germanium region deposited atop a silicon fin. In other embodiments, the source or drain regions 106 and 110 may be formed directly from the fin material 140.

The gate 108 partially surrounds the fins 112 along a portion of the fins 112 between the source region 106 and the drain region 110. The gate 108 may serve as another contact point for the FinFET based dual electronic component 100. In a typical transistor a gate is configured to control the current between the source and drain regions by providing a bias. In contrast, the transfer of energy in the heavily doped semiconductor fins 112 may be independent of a bias on the gate 108 (e.g., see FIGS. 7-8). The operation of the heavily doped semiconductor fins 112 independent of the gate bias allows the FinFET based dual electronic component 100 to behave as either a capacitor or a resistor based on how the contacts (gate 108, source 106, and drain 110) are biased by an integrated circuit.

Figure 7:
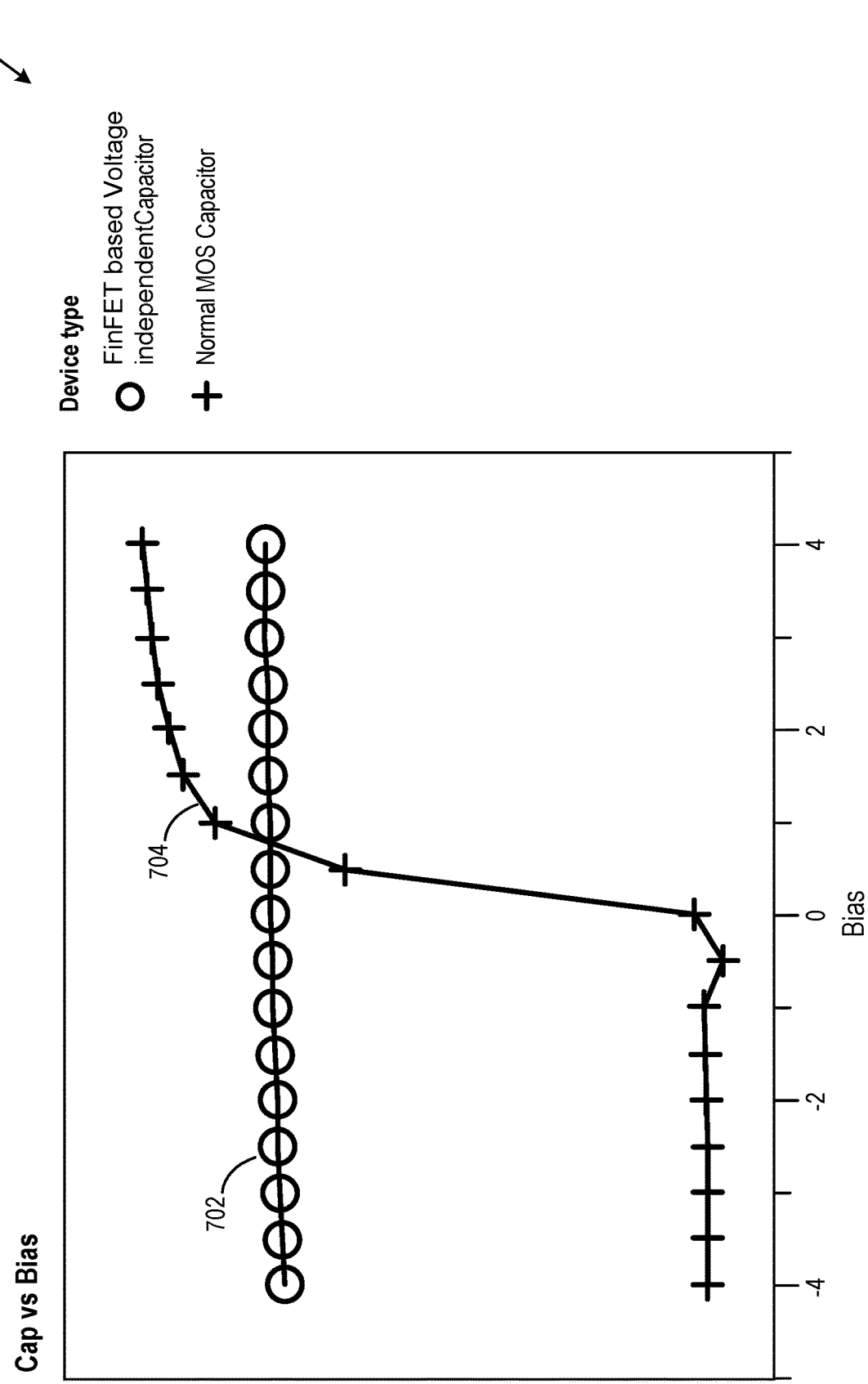
FIG. 7 is a graph illustrating the capacitance of a FinFET based voltage independent dual electronic component when the gate voltage is varied.

The FinFET based dual device 100 can be used as a high density voltage independent capacitor if a first voltage potential is applied to the gate 108 and a second voltage potential (e.g., ground (zero volts)) that is different from the first voltage potential is applied to the source 106 and drain 110. In this arrangement, the gate 108 behaves as a first plate of the capacitor and each highly doped fin 112 acts as a second plate of the capacitor. A gate oxide between the fins 112 and the gate 108 can serve as an insulating layer between the first and the second plate of the capacitor. The capacitor is voltage independent because, as shown in FIG. 7, the capacitor has relatively small variance across a range of voltages applied to the gate 108.

Additionally, the FinFET based dual device 100 can be used as a high density precision resistor. The highly doped fins 112 behave as resistors when a current is carried between the source region 106 and the drain region 110. In some embodiments, the source region 106 and the drain region 110 may include ohmic contacts at either end of the doped fins 112. The preciseness of the resistance can be achieved using high density dopant implantation with low random doping fluctuation and variance. In other words, the density and location of the dopant may be used to set the resistance of the doped fins 112.

Additionally, in some embodiments, gate bias does not affect the resistivity between the source region 106 and the drain region 110. For example, if the gate 108 is operating between 0V and 3.6V the resistance of the source region 106 and the drain region 110 would remain constant. Thus, in some embodiments with multiple fins and a single gate extending across the fins, some fins can be used as a resistor and some fins can be used as a capacitor.

In some embodiments, an N-well 114 is used for isolation. As shown, in some embodiments the fins 112 of the dual electronic component 100 are grown over a p-type substrate 116, and the N-well 114 isolates the fins 112 from the p-type substrate 116. Contacts (102, 104) may be formed on the p-type substrate 116 and the N-well 114. In some embodiments, the p-type substrate contact 102 can be coupled to ground and the n-well contacts 104 can be coupled to a rail voltage.

Figure 2:
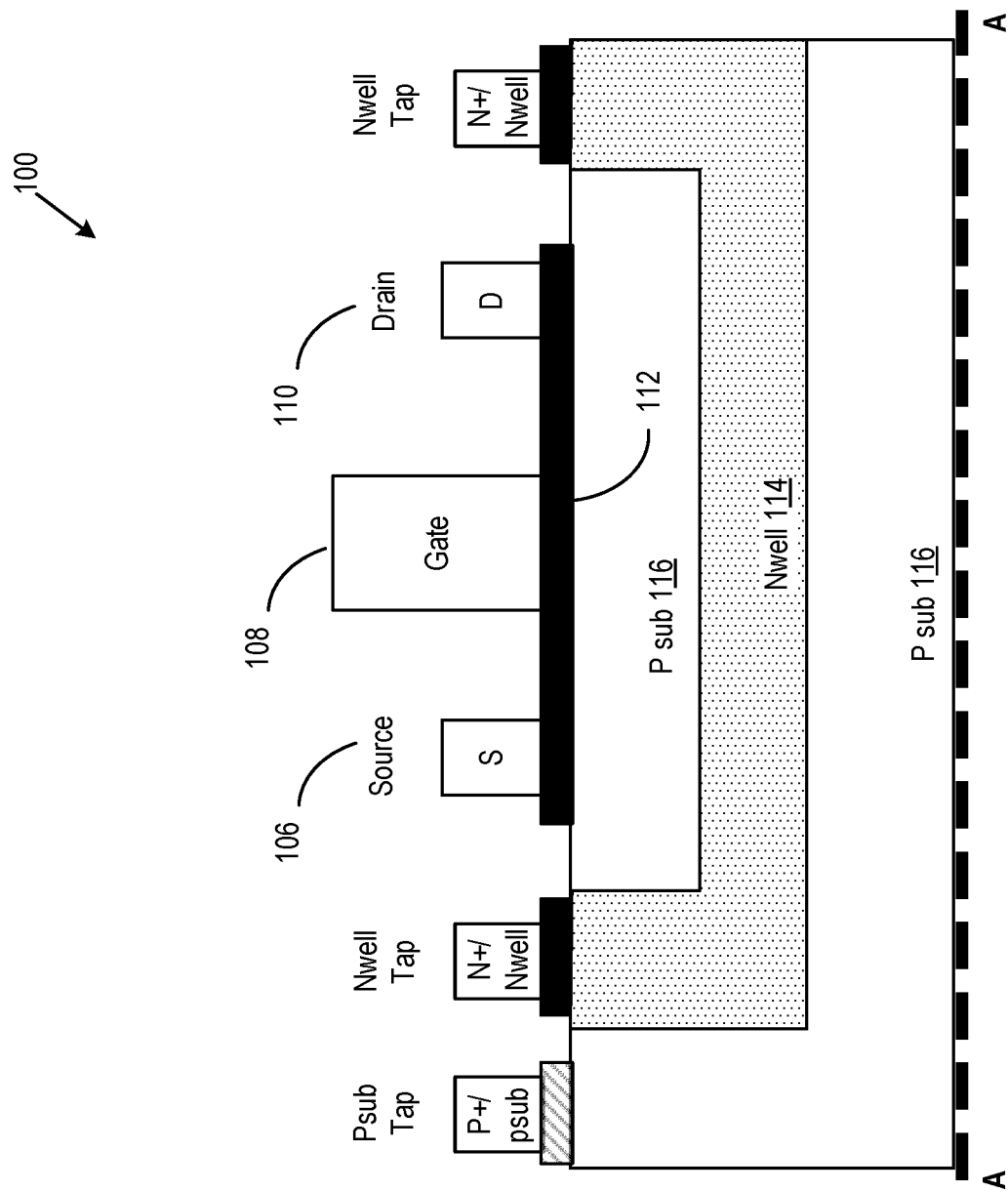
FIG. 2 illustrates a cross-sectional view along a fin of the FinFET based dual electronic component of FIG. 1.

FIG. 2 illustrates a cross-sectional view along a fin of the FinFET based dual electronic component 100 of FIG. 1. As shown, the fin 112 may be grown on p-type substrate 116 with an N-well 114 for isolation.

The source region 106, the drain region 110 and the gate 108 may form three contact points with the fin 112. The bias applied to each of these contact points can cause the FinFET based dual electronic component 100 to behave as either a capacitor or a resistor. For example, the FinFET based dual electronic component 100 may be used as a capacitor where the gate region 108 is a first contact of the capacitor, and the drain region 110 and the source region 106 are a second contact of the capacitor. In some embodiments, to use the FinFET based dual electronic component 100 as a capacitor, the gate region 108 receives a bias and the drain region 110 and the source region 106 are grounded.

The FinFET based dual electronic component 100 can be used as a resistor when the drain region 110 is a first ohmic contact and the source region 106 is a second ohmic contact. An ohmic contact can provide a low resistance junction from a metal to the fin 112. When used as a resistor, the gate 108 is not needed. However, to ease manufacturing, the FinFET based dual electronic component 100 can be made with a gate so it can function as either a capacitor or a resistor.

Figure 3B:
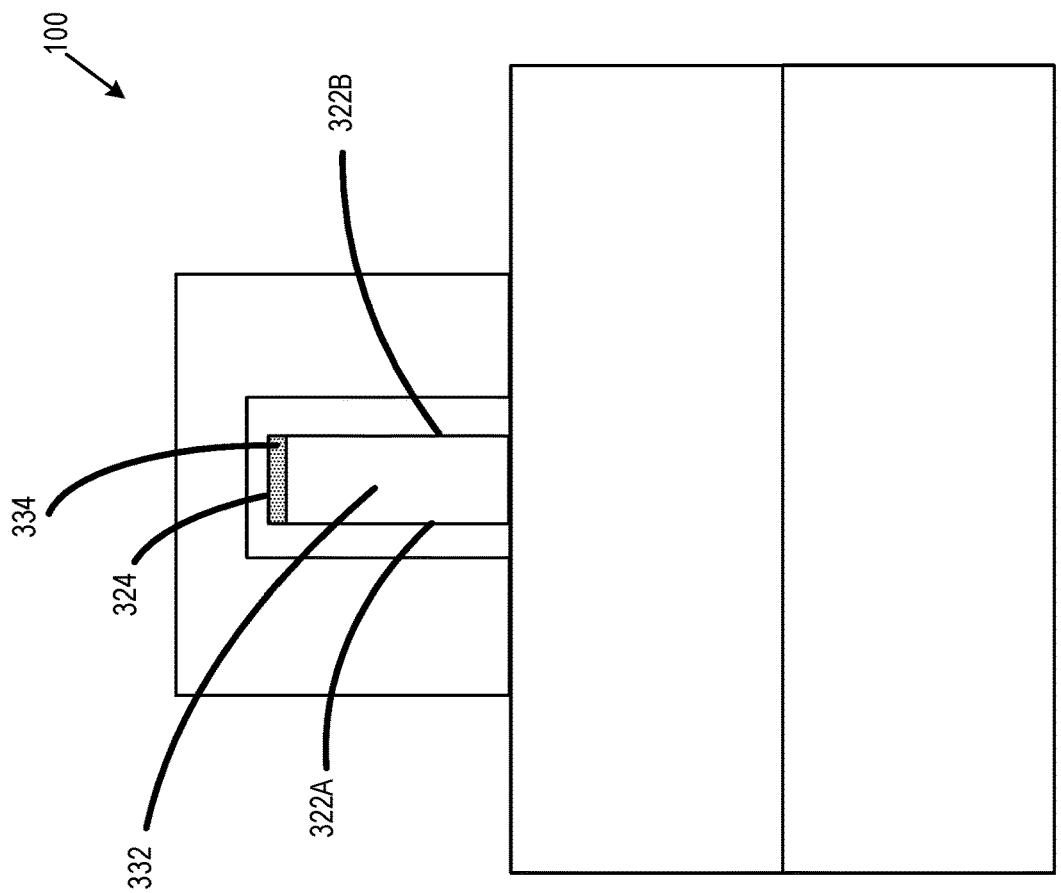
FIG. 3B illustrates a cross-sectional view through the gate of a FinFET based dual electronic component with a semiconductor fin doped along a distal surface, according to some embodiments.
Figure 3A:
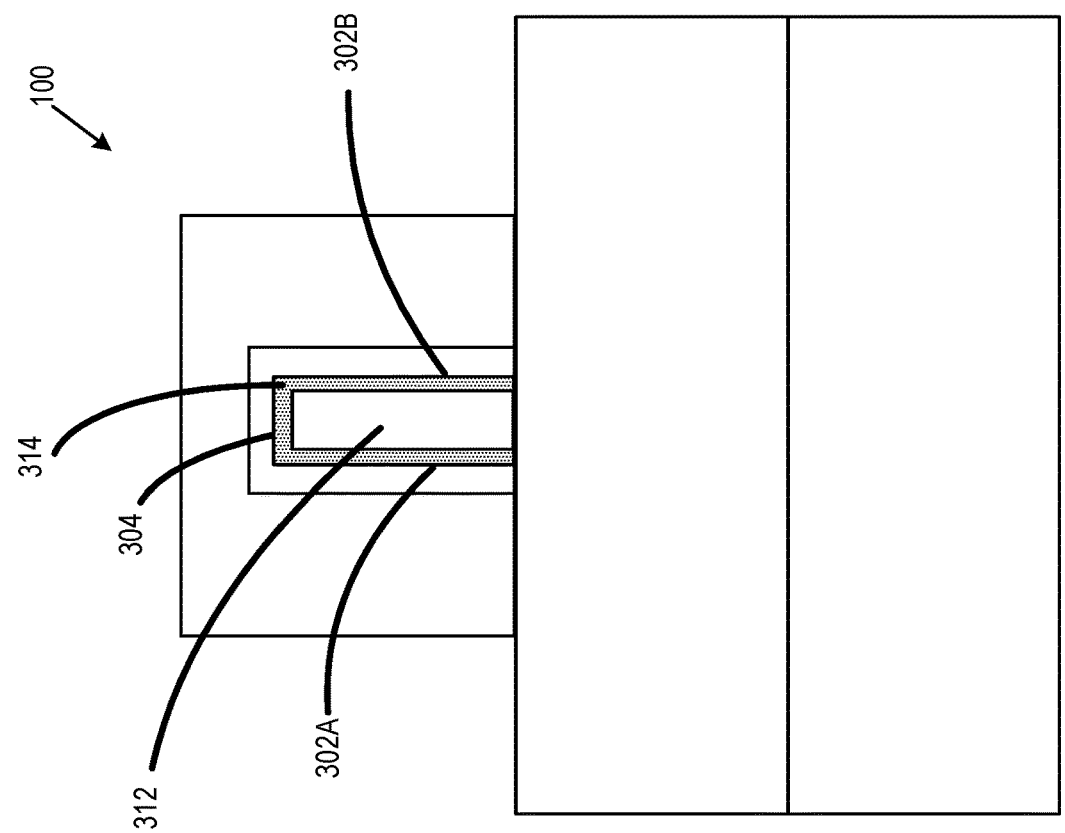
FIG. 3A illustrates a cross-sectional view through the gate of a FinFET based dual electronic component with a semiconductor fin with doped sidewalls and a distal surface, according to some embodiments.

FIGS. 3A and 3B illustrate cross-sectional views of two embodiments using two doping techniques that can be used to change the characteristics of the FinFET based dual electronic component.

FIG. 3A illustrates a cross-sectional view through the gate of a FinFET based dual electronic component 300 with a semiconductor fin 312 with doped sidewalls 302A and 302B and a distal surface, according to some embodiments. The fin 312 of the FinFET based dual electronic component 100 extends from a substrate to form two sidewalls 302A and 302B and a distal portion 304.

The fin 312 is partially surrounded by a gate dielectric 316 and a gate 318. More specifically, the gate dielectric 316 is deposited on the sidewalls 302A and 302B and the distal portion 304 along a portion of the fin 312. The gate region 318 clads the gate dielectric 316.

The fin 312 includes a doped region 314. The doped region 314 includes a high concentration of dopants. The doped region 314 may be so heavily doped that the semiconductor material of the fin 312 becomes degenerate and does not deplete based on bias to the gate 318. In some embodiments, the dopant is more concentrated near a surface of the fin 312 than a core of the fin 312. For example, as shown, the fin sidewalls 302A and 302B and a distal portion 304 may be doped.

The characteristics of the FinFET based dual electronic component 300 may be based on various factors. For example, the FinFET based dual electronic component 300 may be optimized for use as a capacitor by selecting the dopant for a specific type and atomic weight of the dopant. For instance, when a lighter dopant is used, the dopant will not penetrate as deeply as when a heavier dopant is used. Thus, if a light-weight dopant is used, the dopant becomes heavily concentrated at a shallow depth of the fin 312. A thin doped region 314 can allow for a denser capacitor with consistent capacitance across a variety of voltage ranges.

In some embodiments, the fin 312 may be doped with a p-type dopant such as boron, aluminum, nitrogen, gallium, or indium. In other embodiments, the fin 312 may be doped with an n-type dopant such as phosphorous, arsenic, antimony, bismuth, or lithium. The dopant used may be based on the substrate type and the desired doping depth.

The capacitance value can be set by forming specific dimensions of elements of the FinFET based dual electronic component 300. For example, more or less of the fin 312 may be covered by the gate dielectric 316 and a gate 318 to increase or decrease the capacitance. Additionally, more or less gate dielectric 316 may be deposited to make a thicker or thinner insulating layer to increase or decrease the capacitance.

Similar design choices can be made to optimize the FinFET based dual electronic component 300 as a resistor. Precision resistance can be achieved from high density dopant implantation with low random doping fluctuation and variance. The resistance may be modified based on how heavily the fin 312 is doped as well as dimensions of the fin 312.

Relying on doping to create precision resistance has a significant advantage over thin film resistors in that the resistance density of thin film resistors is limited by the thickness of the film of interest, and when the film gets thin enough the uniformity of the film becomes a challenge to maintain and hence increases variation.

To further increase the density of a resistor, when the FinFET based dual electronic component 300 is used as a resistor, the dopants can be limited to only a certain depth or a certain surface of the fin 312. Limiting the dopants to a certain depth or a certain surface can lead to an increase in the resistance by orders of magnitude. As discussed before, the atomic weight of the dopant may affect the depth of the dopant. The closer the dopant peak of the FinFET based dual electronic component 300 is to the surface, the flatness of the capacitance improves. The resistivity of the FinFET based dual electronic component 300 may be tuned by adjusting the diameters and materials of the fin 312. For example, resistance may be estimated by the resistance equation for a sheet (e.g. $R=\rho*(L/tW)$ where $\rho$ is the resistive property of the material, L is the length of the fin, W is the width of the fin, and t is the depth of the dopants). Thus, the closer the dopant peak is to the surface of the fin 312 the higher the resistivity of the FinFET based dual electronic component 300.

FIG. 3B illustrates a cross-sectional view through the gate of a FinFET based dual electronic component 300 with a semiconductor fin 332 doped along a distal portion 324, according to some embodiments. In some embodiments, to increase the resistance the fin 332 is doped along only one surface.

In the illustrated embodiment, the dopant is concentrated on a distal portion 324 of the fin 332. The fin 332 may be vertically doped to generate a doped region 334 along the distal portion 324. The resulting doped region 334 comprises a degenerately doped area on one side of the fin 332. In other embodiments, one or both of the sidewalls 322A, 322B may be doped.

Figure 4:
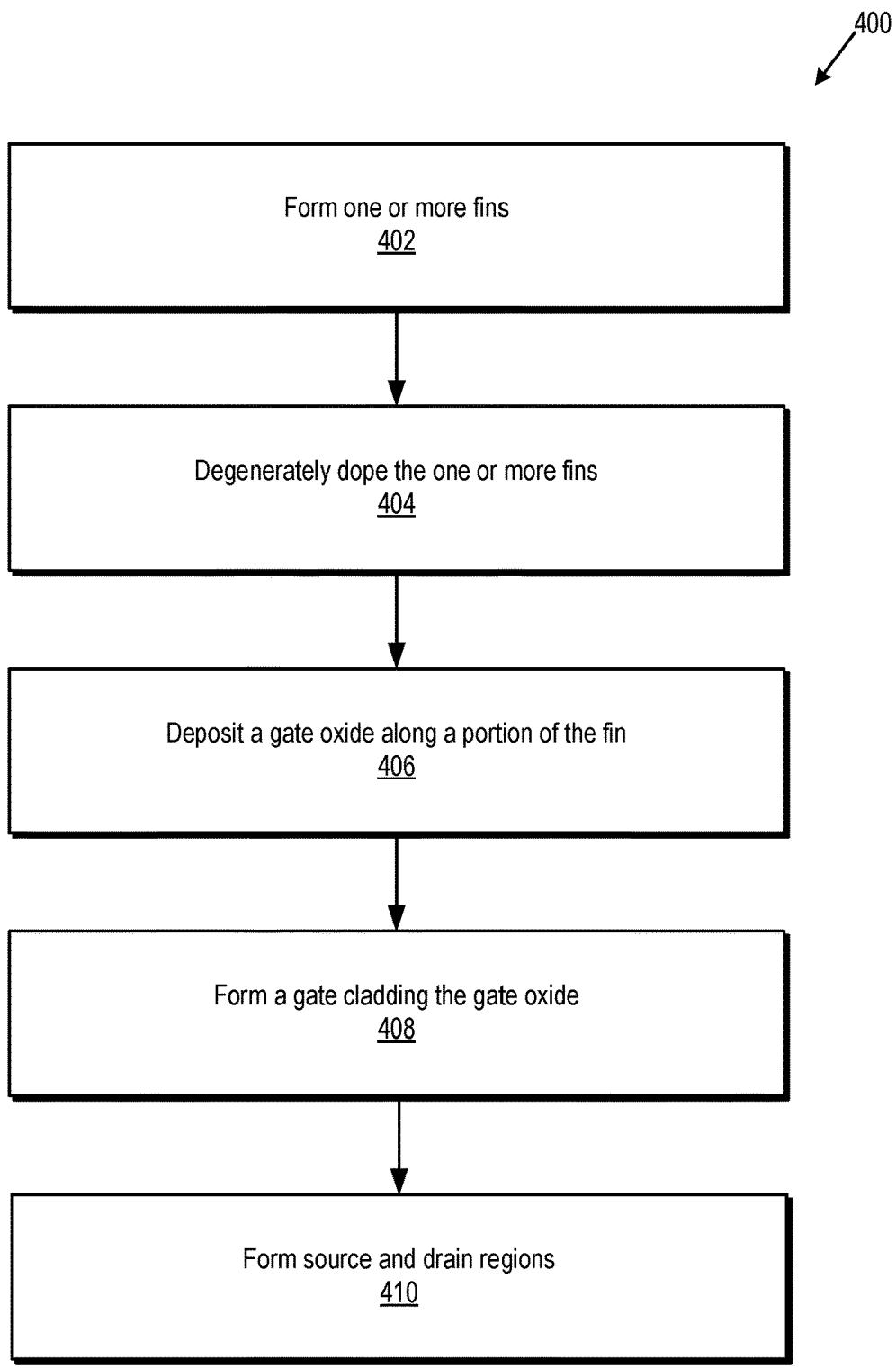
FIG. 4 is a flow diagram illustrating a method for fabricating a FinFET based dual electronic component.

FIG. 4 is a flow diagram illustrating a method 400 for fabricating a FinFET based dual electronic component. The FinFET based dual electronic component may include a source, a drain, a heavily doped fin, and a gate.

The method includes forming 402 a fin with sidewalls and a distal portion, the fin comprising a semiconductor material. The fin may be formed using standard front-side wafer processing techniques. For example, the fins can be formed using etching, photolithography, and/or epitaxial growth. Forming 402 the fin results in a three dimensional structure that extends away from a substrate.

The method further includes doping 404 the fin with enough dopant to cause the semiconductor material of the fin to become degenerate. The degenerately doped fin is more easily able to conduct electrons. In some embodiments, the fin may be doped with a p-type dopant such as boron, aluminum, nitrogen, gallium, or indium. In other embodiments, the fin may be doped with an n-type dopant such as phosphorous, arsenic, antimony, bismuth, or lithium.

The dopant used may be based on the substrate type and the desired doping depth. The dopant can be selected based on dopant type and atomic weight. For example, a lightweight dopant would only penetrate into the fin a small distance and the dopants are more concentrated near a surface of the fin than a core of the fin.

During the doping 404 process, dopants are implanted into the fin with sufficient concentration to make the fin's conductivity not deplete based on bias. For example, if the FinFET based dual electronic component is used as a capacitor, any voltage on the gate may have little influence on the conductivity of the fin resulting in a consistent capacitance.

In some embodiments, the doping 404 may be vertical or angled. When angled doping is used, the dopants can be implanted along the sidewalls and distal portion of the fin. When vertical doping is used, the dopants are concentrated along the distal portion of the fin. Doping 404 the fin along only one surface may result in higher resistivity when the FinFET based dual electronic component is used as a resistor. The density of the FinFET based dual electronic component may be improved by adjusting the doping angle and doping energy, limiting dopants to only a certain depth or a certain surface of the fin leading to an increase in the resistance by orders of magnitude. For example, a lower doping energy would result in a shallower dopant concentration than a higher doping energy.

The method further includes depositing 406 a gate oxide on the sidewalls and the distal portion along a portion of the fin. A gate is formed 408 along the gate oxide at least partially cladding the gate oxide. The thickness of the gate oxide and the dimensions of the gate may be based on the desired capacitance value of the FinFET based dual electronic component The method further includes forming 410 a source region and a drain region. The source and drain regions are located at a first end and a second end of the fin. The regions may include an annealed contact. For example, the drain region may include a first ohmic contact and the source region may include a second ohmic contact.

FIG. 5 illustrates a cross section of a FinFET based dual electronic component 500 on a p-type substrate 516 during various manufacturing stages. The FinFET based dual electronic component in a first stage 500A has a fin 502 formed on a p-type substrate 516. The fin is heavily doped with n-type dopants. The FinFET based dual electronic component in a second stage 500B has an oxide 524 deposited on the fin 502 and a gate 520 formed over the oxide 524. The FinFET based dual electronic component in a second stage 500B has a drain region 510 and a source region 540 formed. The drain region 510 and the source region 540 may include annealed contacts. Each of these manufacturing stages may be accomplished by implementing the method of FIG. 4.

FIG. 6 illustrates a cross section of a FinFET based dual electronic component 600 on an n-well 614 during various manufacturing stages. The FinFET based dual electronic component in a first stage 600A has a fin 602 formed on a p-type substrate 616 with an N-well 614. The fin is heavily doped with p-type dopants. The FinFET based dual electronic component in a second stage 600B has an oxide 624 deposited on the fin 602 and a gate 620 formed over the oxide 624. The FinFET based dual electronic component in a second stage 600B has a drain region 610 and a source region 640 formed. The drain region 610 and the source region 640 may include annealed contacts. Each of these manufacturing stages may be accomplished by implementing the method of FIG. 4

FIG. 7 is a graph 700 illustrating the capacitance of a FinFET based voltage independent dual electronic component when the gate voltage is varied. As shown, when used as a decoupling capacitor, the FinFET based dual electronic component 702 is voltage independent. As the voltage is varied from −4V to 4V, the FinFET based dual electronic component 702 maintains a consistent capacitance. The graph also illustrates how the capacitance of a normal MOS capacitor 704 changes when voltage is varied. When the FinFET based dual electronic component 702 is compared to a normal MOS capacitor 704, the FinFET based dual electronic component 702 is significantly more voltage independent. In this embodiment, the FinFET based dual electronic component 702 has less than 3% capacitance variation when the gate voltage is varied from −4V to 4V.

Figure 8:
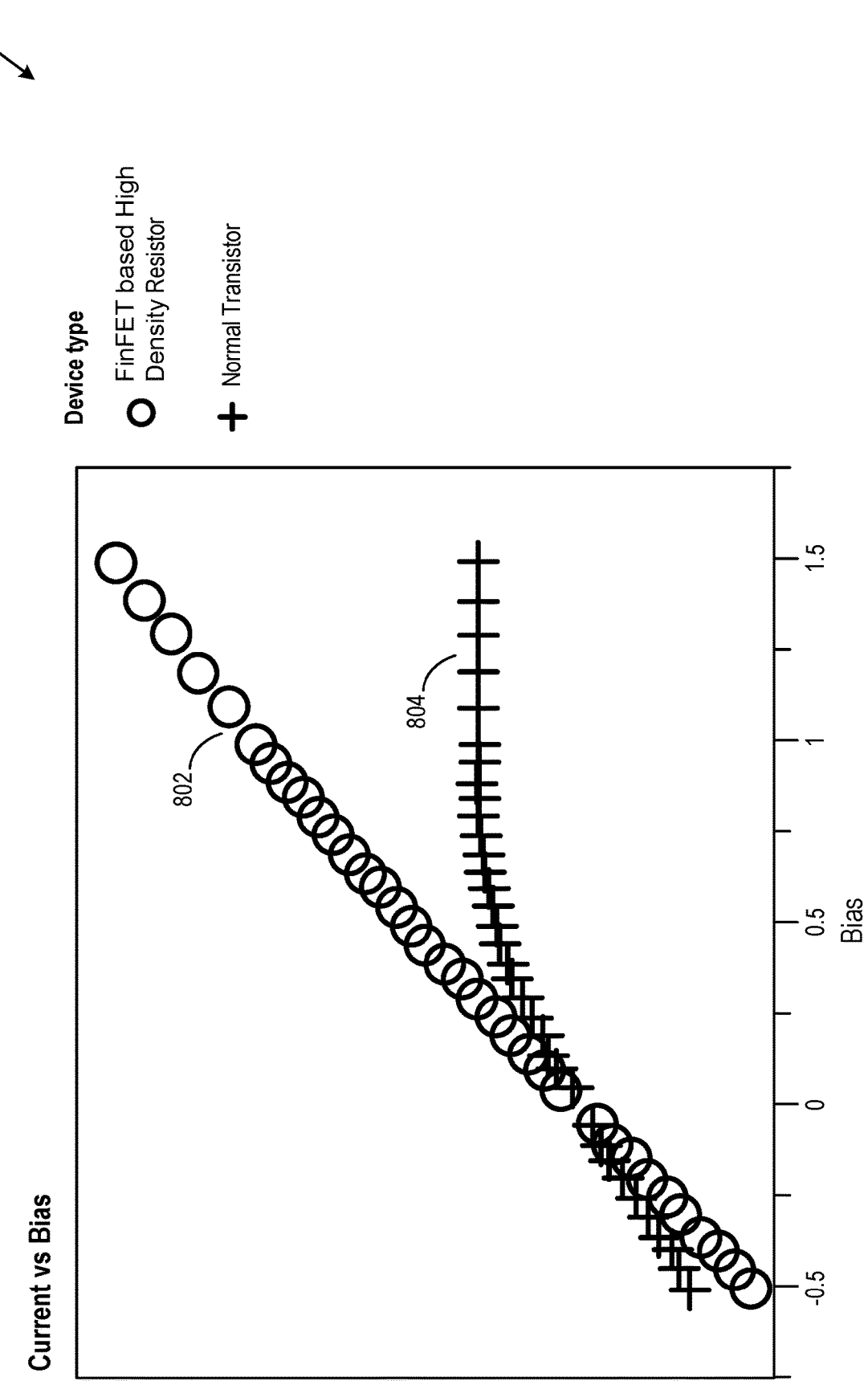
FIG. 8 is a graph illustrating a current between a drain region and a source region of a FinFET based High Density resistor when the drain voltage is varied.

FIG. 8 is a graph 800 illustrating a current between a drain region and a source region of a FinFET based High Density resistor 802 when the drain voltage is varied. As shown, the current in the illustrated embodiment, as the drain voltage is varied between −0.5V and 1.5V, linearly increases showing that the resistance remains constant unlike a normal transistor 804.

Additionally, in some embodiments, the gate bias does not affect the resistivity between the source and the drain. For example, if the gate is operating between 0V and 3.6V, the resistance of the FinFET based High Density resistor 802 would remain constant. Thus, in some embodiments with multiple fins and a single gate extending across the fins, some fins can be used as a resistor and some fins can be used as a capacitor.

Figure 9:
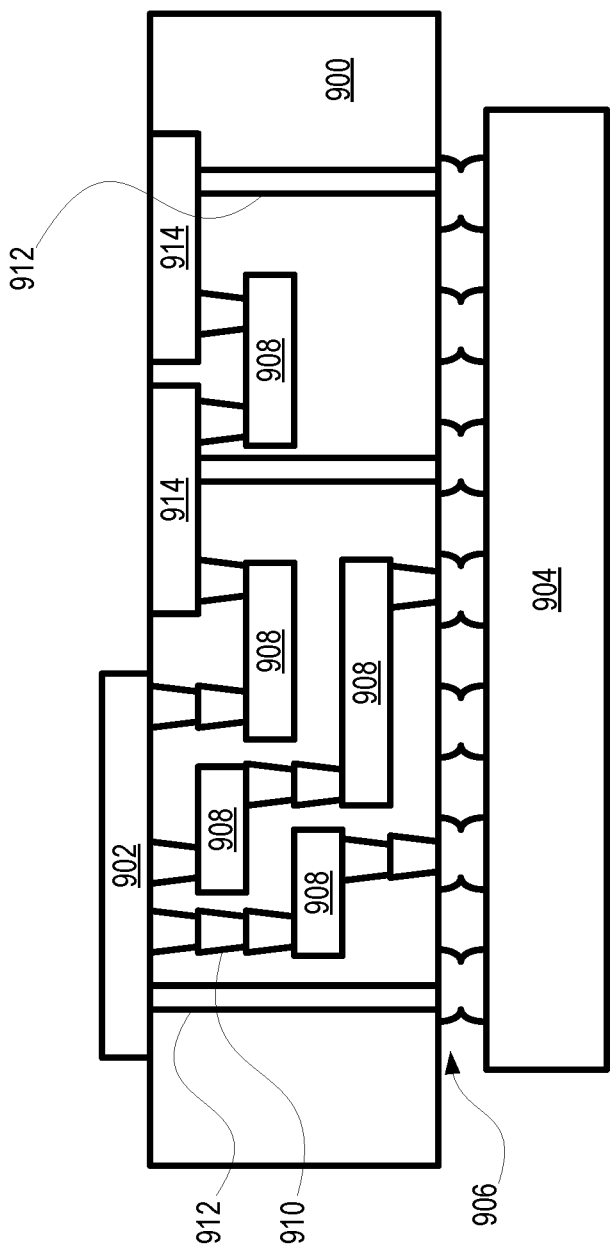
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902, 904 are attached to opposing sides of the interposer 900. In other embodiments, the first and second substrates 902, 904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900.

In accordance with embodiments of the disclosure, apparatuses or processes disclosed herein may be used in the fabrication of interposer 900.

Figure 10:
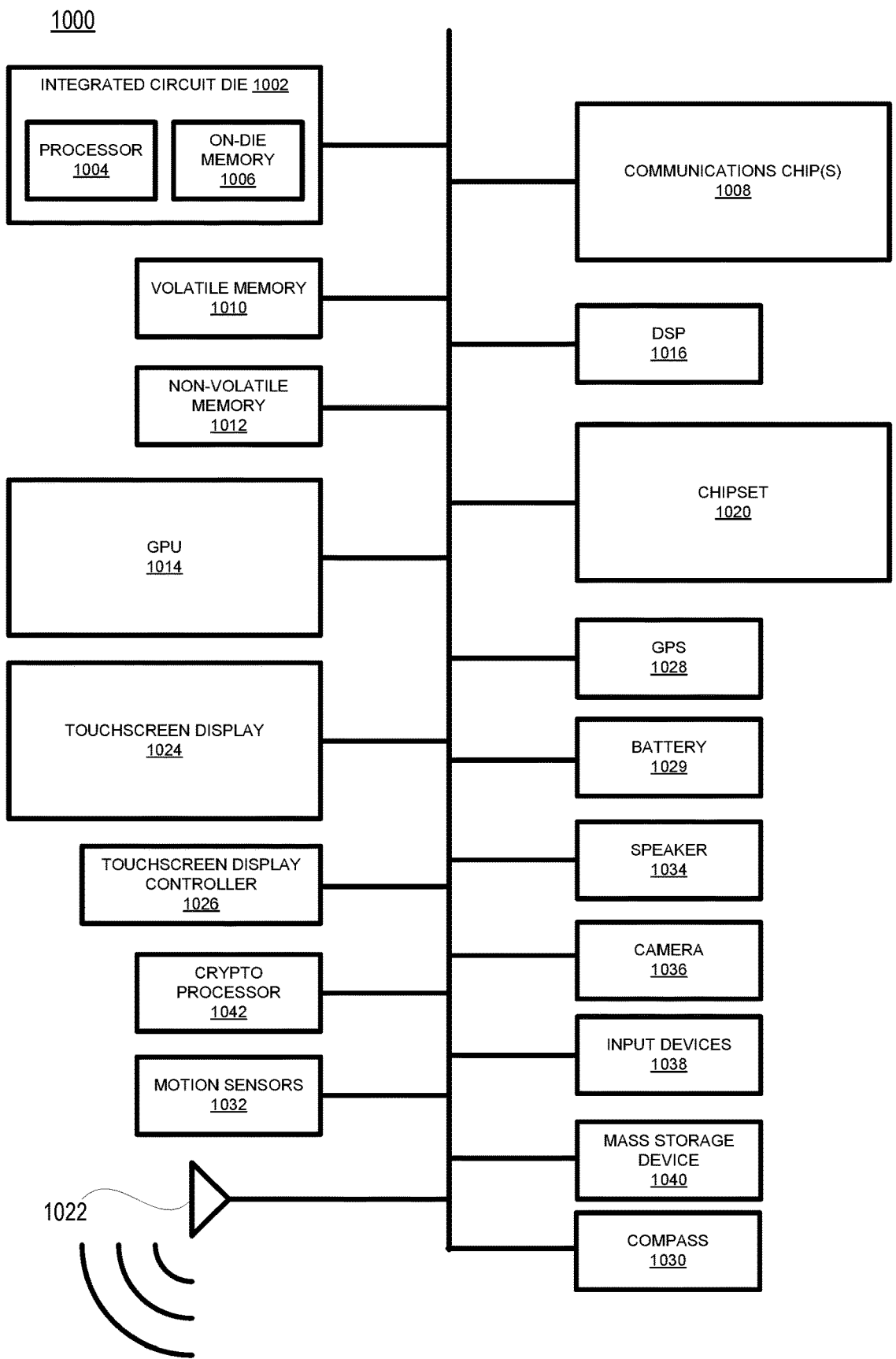
FIG. 10 is a computing device built in accordance with an embodiment of the disclosure.

FIG. 10 illustrates a computing device 1000 in accordance with one embodiment of the disclosure. The computing device 1000 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1000 include, but are not limited to, an integrated circuit die 1002 and at least one communications chip 1008 (e.g., a communications logic unit). In some implementations the communications chip 1008 is fabricated within the integrated circuit die 1002 while in other implementations the communications chip 1008 is fabricated in a separate integrated circuit chip that may be bonded to a substrate or motherboard that is shared with or electronically coupled to the integrated circuit die 1002. The integrated circuit die 1002 may include a processor 1004 (e.g., a CPU) as well as on-die memory 1006, often used as cache memory, which can be provided by technologies such as embedded DRAM (eDRAM), SRAM, or spin-transfer torque memory (STT-MRAM).

Computing device 1000 may include other components that may or may not be physically and electrically coupled to the motherboard or fabricated within an SoC die. These other components include, but are not limited to, volatile memory 1010 (e.g., DRAM), non-volatile memory 1012 (e.g., ROM or flash memory), a graphics processing unit (GPU) 1014, a digital signal processor (DSP) 1016, a crypto processor 1042 (e.g., a specialized processor that executes cryptographic algorithms within hardware), a chipset 1020, at least one antenna 1022 (in some implementations two or more antennae may be used), a display or a touchscreen display 1024, a touchscreen display controller 1026, a battery 1029 or other power source (not shown), a power amplifier (not shown), a voltage regulator (not shown), a global positioning system (GPS) device 1028, a compass 1030, one or more motion sensors 1032 (e.g., a motion coprocessor such as an accelerometer, a gyroscope, a compass, etc.), a microphone (not shown), a speaker 1034, a camera 1036, user input devices 1038 (such as a keyboard, mouse, stylus, and touchpad), and a mass storage device 1040 (such as a hard disk drive, compact disk (CD), digital versatile disk (DVD), and so forth). The computing device 1000 may incorporate further transmission, telecommunication, or radio functionality not already described herein. In some implementations, the computing device 1000 includes a radio that is used to communicate over a distance by modulating and radiating electromagnetic waves in air or space. In further implementations, the computing device 1000 includes a transmitter and a receiver (or a transceiver) that is used to communicate over a distance by modulating and radiating electromagnetic waves in air or space.

The communications chip 1008 may include a communications logic unit configured to transfer data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 1000 may include a plurality of communications chips 1008. For instance, a first communications chip 1008 may be dedicated to shorter range wireless communications such as Wi-Fi, NFC, and Bluetooth and a second communications chip 1008 may be dedicated to longer range wireless communications such as GPS, EDGE, GPRS, CDMA, WiMAX, LTE, Ev-DO, and others.

The processor 1004 of the computing device 1000 includes one or more devices, such as FinFET based dual electronic components used as capacitors and/or resistors, that are formed in accordance with embodiments of the disclosure. The term "processor" may refer to any device or portion of a device that processes electronic data from registers and/or memory to transform that electronic data into other electronic data that may be stored in registers and/or memory.

The communications logic unit 1008 may also include one or more devices, such as FinFET based dual electronic components used as capacitors and/or resistors, that are formed in accordance with embodiments of the disclosure.

In further embodiments, another component housed within the computing device 1000 may contain one or more devices, such as FinFET based dual electronic components used as capacitors and/or resistors, that are formed in accordance with implementations of the disclosure.

In various embodiments, the computing device 1000 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

EXAMPLES

The following is a list of example embodiments that fall within the scope of the disclosure. In order to avoid complexity in providing the disclosure, not all of the examples listed below are separately and explicitly disclosed as having been contemplated herein as combinable with all of the other examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1 is a semiconductor electronic component comprising: a fin with sidewalls and a distal portion, wherein the distal portion is distal to a substrate, the fin comprising a semiconductor material and a dopant, wherein the dopant concentration in the fin provides a Fermi level in either the valence band or the conduction band; a source region on the fin; a drain region located on the fin; a gate dielectric on the sidewalls and the distal portion along a portion of the fin between the source region and the drain region; and a gate region on the gate dielectric.

Example 2 is the semiconductor electronic component of Example 1, wherein the dopant is more concentrated near surfaces of the fin than a core of the fin.

Example 3 is the semiconductor electronic component of Example 1, wherein the fin is doped along only one surface.

Example 4 is the semiconductor electronic component of Example 3, wherein the dopant is concentrated on a surface of the distal portion of the fin.

Example 5 is the semiconductor electronic component according to any one of Examples 1-4, further comprising a capacitor, wherein the gate region is a first terminal of the capacitor, and the drain region and the source region are a second terminal of the capacitor.

Example 6 is the semiconductor electronic component of Example 5, wherein the first terminal is configured to be biased to a first voltage potential and the second terminal is configured to be biased to a second voltage potential that is different from the first voltage potential.

Example 7 is the semiconductor electronic component according to any one of Examples 1-4, further comprising a resistor, wherein the drain region is a first terminal of the resistor and the source region is a second terminal of the resistor.

Example 8 is a method comprising: forming a fin with sidewalls and a distal portion, wherein the distal portion is distal to a substrate, the fin comprising a semiconductor material; doping the fin with enough dopant to cause the semiconductor material of the fin to have a dopant concentration in the fin provides a Fermi level in either the valence band or the conduction band; forming a gate dielectric on the sidewalls and the distal portion along a portion of the fin; forming a first terminal on the gate dielectric; forming a second terminal on of the fin; and forming a third terminal on the fin.

Example 9 is the method of Example 8, wherein the dopant is more concentrated near surfaces of the fin than a core of the fin.

Example 10 is the method of Example 8, wherein the fin is doped along only one surface.

Example 11 is the method of Example 10, wherein doping the fin comprises vertically doping the fin to cause the dopant to be concentrated on a surface of the distal portion of the fin.

Example 12 is the method of Example 8, wherein the first terminal forms a top plate of a capacitor and the fin forms a bottom plate of the capacitor.

Example 13 is the method of Example 12, wherein the first terminal is configured to be biased to a first voltage potential and the second terminal and the third terminal are configured to be biased to a second voltage potential that is different from the first voltage potential.

Example 14 is the method of Example 8, wherein the fin is configured to be a resistor, and wherein the second terminal is configured to be biased to a first voltage potential and the third terminal is configured to be biased to a second voltage potential that is different from the first voltage potential.

Example 15. A computing device comprising one or more semiconductor electronic components, each of the one or more semiconductor electronic components comprising: a fin with sidewalls and a distal portion, wherein the distal portion is distal to a substrate, the fin comprising a semiconductor material and a dopant, wherein the dopant concentration in the fin provides a Fermi level in either the valence band or the conduction band; a source region located on a first end of the fin; a drain region located on a second end of the fin; a gate dielectric on the sidewalls and the distal portion along a portion of the fin between the source region and the drain region; and a gate region at least partially cladding the gate dielectric.

Example 16 is the computing device of Example 15, further comprising: a processor mounted on the substrate; a memory unit capable of storing data; a graphics processing unit; an antenna within the computing device; a display on the computing device; a battery within the computing device; a power amplifier within the processor; and a voltage regulator within the processor; wherein at least one of the processor, the memory unit, the graphics processing unit, or the voltage regulator comprises the one or more semiconductor electronic components.

Example 17 is the computing device of Example 15, wherein the dopant is more concentrated near a surface of the fin than a core of the fin.

Example 18 is the computing device of Example 15, wherein the fin is doped along only one surface.

Example 19 is the computing device according to any one of Examples 15-18, wherein the one or more semiconductor electronic components comprise a capacitor including the fin, the source region, the drain region, the gate dielectric and the gate region.

Example 20 is the computing device according to any one of Examples 15-18, wherein the one or more semiconductor electronic components comprise a resistor including the fin, the source region, the drain region, the gate dielectric and the gate region.

Example 21 is a method of manufacturing a semiconductor electronic component comprising: forming a fin with sidewalls and a distal portion, wherein the distal portion is distal to a substrate, the fin comprising a semiconductor material and a dopant, wherein the dopant concentration in the fin provides a Fermi level in either the valence band or the conduction band; doping a source region on the fin; doping a drain on the fin; forming a gate dielectric on the sidewalls and the distal portion along a portion of the fin between the source region and the drain region; and forming a gate region at least partially along the gate dielectric.

Example 22 is the method of manufacturing a semiconductor electronic component of Example 21, wherein the dopant is more concentrated near surfaces of the fin than a core of the fin.

Example 23 is the method of manufacturing a semiconductor electronic component of Example 21, wherein the fin is doped along only one surface.

Example 24 is the method of manufacturing a semiconductor electronic component of Example 23, wherein the dopant is concentrated on a surface of the distal portion of the fin.

Example 25 is the method of manufacturing a semiconductor electronic component of Example 21, wherein the gate region is a first terminal of a capacitor, and the drain region and the source region are a second terminal of the capacitor.

Example 26 is the method of manufacturing a semiconductor electronic component of Example 25, wherein the first terminal is configured to be biased to a first voltage potential and the second terminal is configured to be biased to a second voltage potential that is different from the first voltage potential.

Example 27 is the method of manufacturing a semiconductor electronic component of Example 21, wherein the drain region is a first terminal of a resistor and the source region is a second terminal of the resistor.

Example 28 is an apparatus comprising: a fin with sidewalls and a distal portion, wherein the distal portion is distal to a substrate, the fin comprising a semiconductor material, wherein the fin is doped with enough dopant to cause the semiconductor material of the fin to have a dopant concentration in the fin provides a Fermi level in either the valence band or the conduction band; a gate dielectric on the sidewalls and the distal portion along a portion of the fin; a first terminal at least partially along the gate dielectric; a second terminal at the first end of the fin; and a third terminal on a second end of the fin.

Example 29 is the apparatus of Example 28, wherein the dopant is more concentrated near surfaces of the fin than a core of the fin.

Example 30 is the apparatus of Example 28, wherein the fin is doped along only one surface.

Example 31 is the apparatus of Example 30, wherein the fin is vertically doped to cause the dopant to be concentrated on a surface of the distal portion of the fin.

Example 32 is the apparatus according to any one of Examples 28-31, wherein the first terminal forms a top plate of a capacitor and the fin forms a bottom plate of the capacitor.

Example 33 is the apparatus of Example 32, wherein the first terminal is configured to be biased to a first voltage potential and the second terminal and the third terminal are configured to be biased to a second voltage potential that is different from the first voltage potential.

Example 34 is the apparatus according to any one of Examples 28-31, wherein the fin is configured to be a resistor, and wherein the second terminal is configured to be biased to a first voltage potential and the third terminal is configured to be biased to a second voltage potential that is different from the first voltage potential.

Example 35 is a method of operating a computing device comprising one or more transistors, the method comprising: selectively applying a source voltage potential a source potential to a source region; selectively applying a drain voltage potential to a drain region; and selectively applying a gate voltage potential to an electrically conductive material at least partially surrounding a distal portion of a fin, the fin comprising a semiconductor material and a dopant, wherein the concentration in the fin provides a Fermi level in either the valence band or the conduction band.

Example 36 is the method of Example 35, wherein the dopant is more concentrated near a surface of the fin than a core of the fin.

Example 37 is the method of Example 35, wherein the fin is doped along only one surface.

Example 38 is the method of Example 35, wherein a capacitance is formed when a gate voltage potential is applied that is different than the source voltage potential and the drain voltage potential.

Example 39 is the method of Example 35, wherein the fin provides resistance when the drain voltage potential is different than the source voltage potential.

Example 40 is a means for performing at least a portion of the method according to any one of Examples 8-14, 21-27, and 25-39.

Example 41 is a computer-readable storage medium comprising computer-readable instructions stored thereon, the computer-readable instructions configured to instruct a processor to perform at least a portion of the method according to any one of Examples 8-14, 21-27, and 25-39.

Example 42 is a capacitor comprising: a fin with sidewalls and a distal portion, wherein the distal portion is distal to a substrate, the fin comprising a semiconductor material and a dopant, wherein the dopant concentration in the fin provides a Fermi level in either the valence band or the conduction band; a source region on the fin; a drain region on the fin, wherein the drain region and the source region are a first terminal of the capacitor; a gate dielectric on the sidewalls and the distal portion along a portion of the fin between the source region and the drain region; and a gate region on the gate dielectric, wherein the gate region is a second terminal of the capacitor.

Example 43 is the capacitor of example 42, wherein the first terminal is configured to be biased to a first voltage potential and the second terminal is configured to be biased to a second voltage potential that is different from the first voltage potential.

Example 44 is a resistor comprising: a fin with sidewalls and a distal portion, wherein the distal portion is distal to a substrate, the fin comprising a semiconductor material and a dopant, wherein the dopant concentration in the fin provides a Fermi level in either the valence band or the conduction band; a source region on the fin; a drain region on the fin, wherein the drain region is a first terminal of the resistor and the source region is a second terminal of the resistor; a gate dielectric on the sidewalls and the distal portion along a portion of the fin between the source region and the drain region; and a gate region on the gate dielectric.

Example 45 is the resistor of example 44, wherein the dopant is concentrated on a surface of the distal portion of the fin.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A semiconductor electronic component comprising:
   a fin with sidewalls and a distal portion, wherein the distal portion is distal to a substrate, the fin comprising a semiconductor material and a dopant, wherein the dopant concentration in the fin provides a Fermi level in either the valence band or the conduction band, and wherein the dopant concentration in the fin is non-uniform within the fin;
   a source region on the fin;
   a drain region on the fin;
   a gate dielectric directly on the sidewalls and directly on the distal portion along a portion of the fin between the source region and the drain region; and
   a gate region on the gate dielectric.

2. The semiconductor electronic component of claim 1, wherein the dopant is more concentrated near surfaces of the fin than a core of the fin.

3. The semiconductor electronic component of claim 1, wherein the fin is doped along only one surface.

4. The semiconductor electronic component of claim 3, wherein the dopant is concentrated on a surface of the distal portion of the fin.

5. The semiconductor electronic component of claim 1, further comprising a capacitor, wherein the gate region is a first terminal of the capacitor, and the drain region and the source region are a second terminal of the capacitor.

6. The semiconductor electronic component of claim 5, wherein the first terminal is configured to be biased to a first voltage potential and the second terminal is configured to be biased to a second voltage potential that is different from the first voltage potential.

7. The semiconductor electronic component of claim 1, further comprising a resistor, wherein the drain region is a first terminal of the resistor and the source region is a second terminal of the resistor.

8. A method comprising:
   forming a fin with sidewalls and a distal portion, wherein the distal portion is distal to a substrate, the fin comprising a semiconductor material;
   doping the fin with enough dopant to cause the semiconductor material of the fin to have a dopant concentration in the fin that provides a Fermi level in either the valence band or the conduction band, and wherein the dopant concentration in the fin is non-uniform within the fin;
   forming a gate dielectric directly on the sidewalls and directly on the distal portion along a portion of the fin;
   forming a first terminal on the gate dielectric;
   forming a second terminal on of the fin; and
   forming a third terminal on the fin.

9. The method of claim 8, wherein the dopant is more concentrated near surfaces of the fin than a core of the fin.

10. The method of claim 8, wherein the fin is doped along only one surface.

11. The method of claim 10, wherein doping the fin comprises vertically doping the fin to cause the dopant to be concentrated on a surface of the distal portion of the fin.

12. The method of claim 8, wherein the first terminal forms a top plate of a capacitor and the fin forms a bottom plate of the capacitor.

13. The method of claim 12, wherein the first terminal is configured to be biased to a first voltage potential and the second terminal and the third terminal are configured to be biased to a second voltage potential that is different from the first voltage potential.

14. The method of claim 8, wherein the fin is configured to be a resistor, and wherein the second terminal is configured to be biased to a first voltage potential and the third terminal is configured to be biased to a second voltage potential that is different from the first voltage potential.

15. A computing device comprising one or more semiconductor electronic components, each of the one or more semiconductor electronic components comprising:
a fin with sidewalls and a distal portion, wherein the distal portion is distal to a substrate, the fin comprising a semiconductor material and a dopant, wherein the dopant concentration in the fin provides a Fermi level in either the valence band or the conduction band, and wherein the dopant concentration in the fin is non-uniform within the fin;
a source region located on a first end of the fin;
a drain region located on a second end of the fin;
a gate dielectric directly on the sidewalls and directly on the distal portion along a portion of the fin between the source region and the drain region; and
a gate region at least partially cladding the gate dielectric.

16. The computing device of claim 15, further comprising:
a processor mounted on the substrate;
a memory unit capable of storing data;
a graphics processing unit;
an antenna within the computing device;
a display on the computing device;
a battery within the computing device;
a power amplifier within the processor; and
a voltage regulator within the processor;
wherein at least one of the processor, the memory unit, the graphics processing unit, or the voltage regulator comprises the one or more semiconductor electronic components.

17. The computing device of claim 15, wherein the dopant is more concentrated near a surface of the fin than a core of the fin.

18. The computing device of claim 15, wherein the fin is doped along only one surface.

19. The computing device of claim 15, wherein the one or more semiconductor electronic components comprise a capacitor including the fin, the source region, the drain region, the gate dielectric and the gate region.

20. The computing device of claim 15, wherein the one or more semiconductor electronic components comprise a resistor including the fin, the source region, the drain region, the gate dielectric and the gate region.

21. A capacitor comprising:
a fin with sidewalls and a distal portion, wherein the distal portion is distal to a substrate, the fin comprising a semiconductor material and a dopant, wherein the dopant concentration in the fin provides a Fermi level in either the valence band or the conduction band, and wherein the dopant concentration in the fin is non-uniform within the fin;
a source region on the fin;
a drain region on the fin, wherein the drain region and the source region are a first terminal of the capacitor;
a gate dielectric directly on the sidewalls and directly on the distal portion along a portion of the fin between the source region and the drain region; and
a gate region on the gate dielectric, wherein the gate region is a second terminal of the capacitor.

22. The capacitor of claim 21, wherein the first terminal is configured to be biased to a first voltage potential and the second terminal is configured to be biased to a second voltage potential that is different from the first voltage potential.

* * * * *